United States Patent
Choi et al.

(10) Patent No.: US 7,557,445 B2
(45) Date of Patent: Jul. 7, 2009

(54) MULTILAYER SUBSTRATE AND THE MANUFACTURING METHOD THEREOF

(75) Inventors: Don C. Choi, Incheon (KR);
Dong-Hwan Lee, Gyeonggi-do (KR);
Hee-Soo Yoon, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 378 days.

(21) Appl. No.: 11/431,021

(22) Filed: May 10, 2006

(65) Prior Publication Data
US 2006/0255456 A1   Nov. 16, 2006

(30) Foreign Application Priority Data
May 10, 2005   (KR) .................. 10-2005-0038680

(51) Int. Cl.
*H01L 23/48* (2006.01)
*H01R 12/00* (2006.01)
*H05K 1/00* (2006.01)

(52) U.S. Cl. .................. 257/748; 439/74; 439/75; 439/931; 174/138 D; 174/138 G; 361/758; 361/792

(58) Field of Classification Search .................. 257/723, 257/685, 686, 777, E25.005, E25.006, E25.027, 257/E23.085, 748; 361/301.4, 728–736, 361/747, 758, 792, 804; 439/74, 75, 931; 174/138 D, 138 G See application file for complete search history.

(56) References Cited

U.S. PATENT DOCUMENTS

| 5,174,763 | A  | * | 12/1992 | Wilson .................. 439/66 |
| 5,411,400 | A  | * | 5/1995 | Subrahmanyan et al. ...... 439/68 |
| 6,586,836 | B1 | * | 7/2003 | Ma et al. .................. 257/723 |
| 6,734,541 | B2 | * | 5/2004 | Shimoe et al. .............. 257/686 |

FOREIGN PATENT DOCUMENTS

KR        20-0124209        6/1998

OTHER PUBLICATIONS

Korean Notice of Preliminary Rejection, dated Aug. 31, 2006, and issued in priority Korean Patent Application No. 2005-38680.

* cited by examiner

*Primary Examiner*—Jasmine J Clark

(57) ABSTRACT

A multilayer substrate, comprising a first substrate, a connector and a second substrate, is disclosed. The first substrate has a circuit pattern. The connector, coupling onto the first substrate, has a ring structure, in which a plurality of holes are separated a predetermined distance from one another. The second substrate, coupling onto the second substrate by inserting the connector, has a circuit pattern, which is electrically connected to a circuit pattern formed on the first substrate using the plurality of holes formed on the connector. A multilayer substrate and a method for producing it in accordance with the present invention can shield the EMI generated by a high-speed switching element.

2 Claims, 7 Drawing Sheets

MULTILAYER SUBSTRATE AND THE MANUFACTURING METHOD THEREOF

TECHNICAL FIELD AND BACKGROUND OF THE INVENTION

The present invention relates to a substrate and a method for producing it. More specifically, the present invention relates to a multilayer substrate and a method for producing the multilayer substrate.

Recently, with the accelerated tendency of ubiquitous computing and digital convergence, semiconductor integrated circuits are being integrated enough to perform system functions with a single chip, the signal processing is speeding up, and less power is needed in order to fit in mobile environments. In these electronic environments, the technology to design a circuit to secure the noise margin by lowering the signal-to-noise ratio is being increasingly important. Besides, as universal electronic devices with Wireless communication become more broadband, to meet the increased amount of data communication and the demand for high-speed signal processing, products become smaller, and parts are more densely mounted to implement multi-functions, electrical features, such as signal integrity, power integrity, electromagnetic interference and electromagnetic integrity, are becoming very important.

According to conventional art, when printed circuit boards (PCBs) are stacked, the electrical signal between the stacked PCBs was connected at a specific part. That is, a module pin was brought close to an arranged plate to connect an electrical signal between PCBs. As such, when locally connecting a signal, a feedback current on the signal can be formed by a pin, adjacent to the signal line, and an electrode pattern, causing problems, such as deterioration of signal integrity and electromagnetic interference (EMI), when a high-speed signal is delivered.

The "stacked processor construction" presented in U.S. Pat. No. 6,362,974 discloses only an outline of arrangement and connection conceptually, not a specific method for connecting a signal line, thereby not being able to solve the problems of signal integrity and EMI, described above.

BRIEF DESCRIPTION OF THE DRAWINGS

These and other features, aspects, and advantages of the present invention will become better understood with regard to the following description, appended claims, and accompanying drawings where:

KEY DRAWING

FIG. 1

SUMMARY OF THE INVENTION

Figure 1:
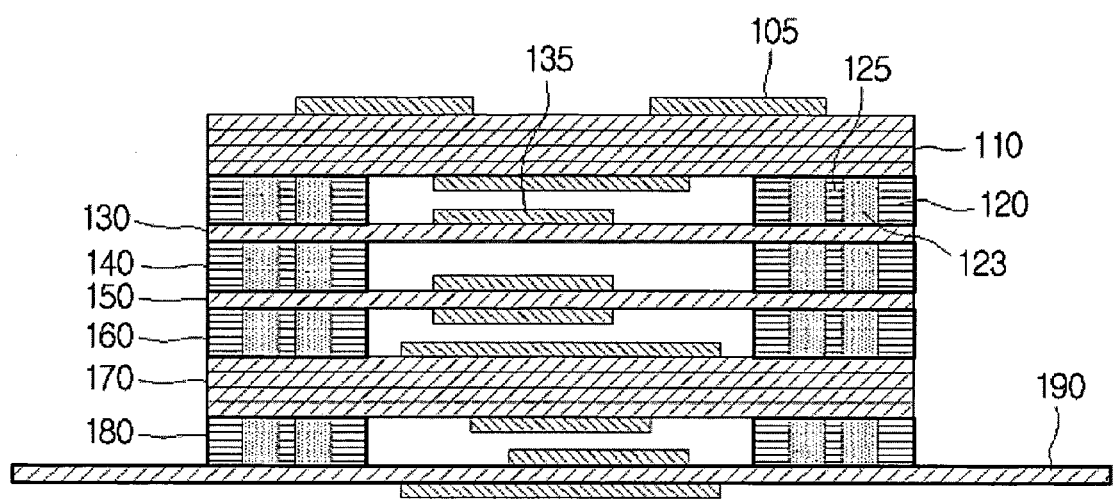
FIG. 1 is a sectional view of a multilayer substrate in accordance with a preferred embodiment of the present invention.

The present invention discloses a multilayer substrate, which can shield EMI that can be generated by a high-speed switching element, and a method for producing it.

The present invention also discloses a multilayer substrate, which improves the signal integrity and EMI capacity by sufficiently securing a feedback current path, and a method for producing it.

The present invention also discloses a multilayer substrate, with constant impedance, by delivering the signal current through a coaxial cable between substrates and a method for producing it.

An aspect of the invention features a multilayer substrate. The multilayer substrate comprises a first substrate, a connector and a second substrate. The first substrate has a circuit pattern. The connector, coupling onto the first substrate, has a ring structure, in which a plurality of holes are separated a predetermined distance from one another. The second substrate, coupling onto the second substrate by inserting the connector, has a circuit pattern, which is electrically connected to a circuit pattern formed on the first substrate using the plurality of holes formed on the connector.

Here, the hole formed on the connector can be a circle, and the inside wall of the plurality of holes formed on the connector can be coated with a conductive material.

The multilayer substrate in accordance with the present invention can further have a coupling pin, which electrically connects the inside wall of a hole, formed on the connector, to a circuit pattern corresponding to a signal line formed on the first substrate.

The connector can further have a body, a dielectric and a connecting part. The body is comprised of a conductive material. The dielectric coats the inside wall of the plurality of holes. The connecting part is comprised of a conductive material, which coats the dielectric.

A circuit corresponding to the signal line of the first substrate can be electrically connected to a circuit corresponding to the signal line of the second substrate via the connecting part, and the body of the connector can be connected to a ground and the connecting part of the connector can be connected to a signal line.

Another aspect of the present invention features a multilayer substrate having a first substrate, a connector, a first coupling pin, a second substrate and a second coupling pin. The first substrate has a circuit pattern. The connector, coupling onto the first substrate, has a body and a connector. The body has a plurality of holes, which are separated a predetermined distance from one another. The body is comprised of a conductive material. The cross section of the connecting part is an "H" shape. The connecting part is comprised of a dielectric and a conductive material. The dielectric coats the inside wall of the plurality of holes, and the conductive material coats the dielectric. One end of the first coupling pin is housed in a slot formed on a connecting part of the connector, and the other end is electrically connected to a circuit, which corresponds to a signal line formed on the first substrate. The second substrate, coupling onto the first substrate by inserting the connector, has a circuit pattern, which is electrically connected to a circuit pattern formed on the first substrate using the plurality of holes formed on the connector. One end of the second coupling pin is housed in a slot formed on a connecting part of the connector, and the other end is electrically connected to a circuit, which corresponds to a signal line formed on the second substrate.

Here, the hole formed on the connector can be a circle, and the body of the connector can be connected to a ground.

Another aspect of the present invention features a method for producing a multilayer substrate. The method includes stacking a first substrate, on which a circuit pattern is formed. A connector, coupling onto the first substrate, is stacked. The connector has a ring structure, in which a plurality of holes are separated a predetermined distance from one another. A second substrate, coupling onto the first substrate by inserting the connector, is stacked. The second substrate has a circuit pattern, which is electrically connected to a circuit pattern, formed on the first substrate, using the plurality of holes formed on the connector.

Here, the hole formed on the connector can be a circle, and the inside wall of the plurality of holes formed on the connector can be coated with a conductive material.

The method for producing a multilayer substrate in accordance with the present invention can further have the step of stacking a coupling pin, which electrically connects the inside wall of a hole, formed on the connector, to a circuit pattern corresponding to a signal line formed on the first substrate.

In the method, the connector can further have a body, a dielectric and a connecting part. The body is comprised of a conductive material. The dielectric coats the inside wall of the plurality of holes. The connecting part is comprised of a conductive material, which coats the dielectric.

A circuit corresponding to the signal line of the first substrate can be electrically connected to a circuit corresponding to the signal line of the second substrate via the connecting part.

The body of the connector can be connected to a ground and the connecting part of the connector can be connected to a signal line.

DETAILED DESCRIPTION OF THE INVENTION

Hereinafter, preferred embodiments of the multilayer substrate and the method for producing it in accordance with the present invention will be described with reference to the accompanying drawings. In referencing the accompanying drawings, identical elements are assigned the same reference numerals, regardless of their figure numbers, and the description for identical elements having the same reference numerals will not be repeated.

Figure 2:
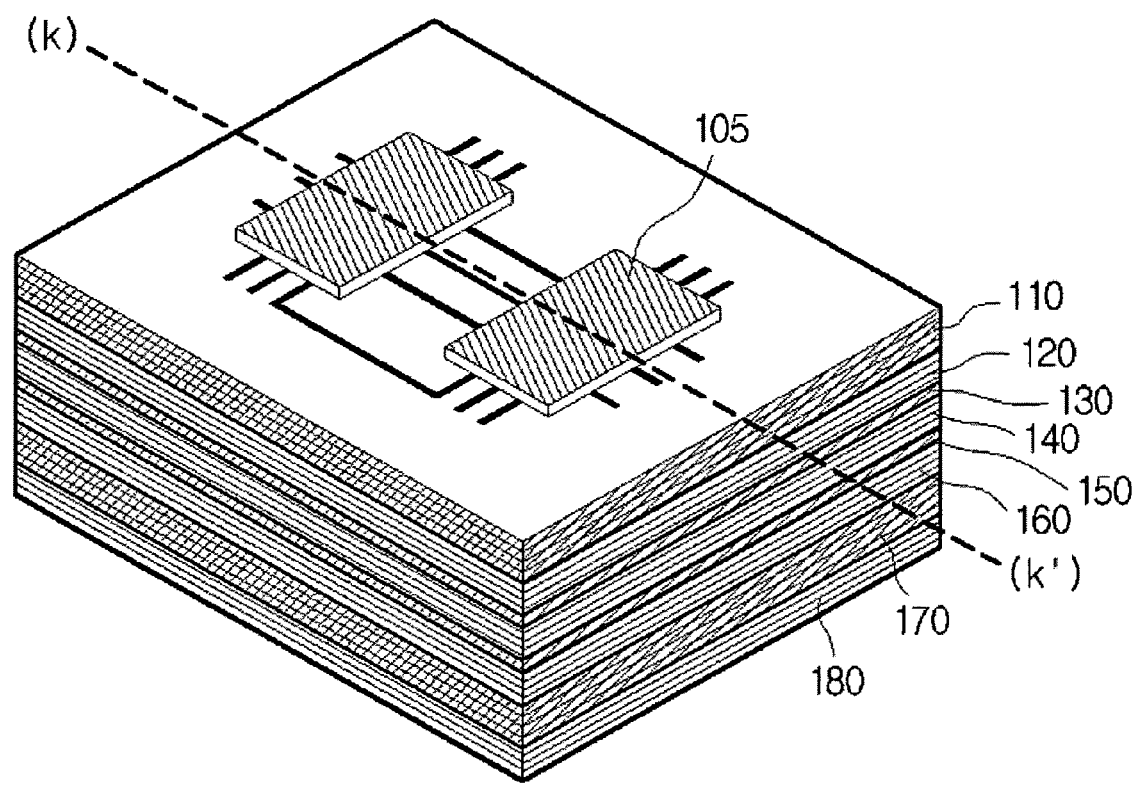
FIG. 2 is a perspective view of a multilayer substrate in accordance with a preferred embodiment of the present invention.

FIG. 1 is a sectional view of a multilayer substrate, in which a single-side PCB, double-side PCBs and multilayer PCBs are stacked, in accordance with a preferred embodiment of the present invention, and FIG. 2 is a perspective view of a multilayer substrate illustrated in FIG. 1. Referring to FIGS. 1 and 2, high-speed switching elements 105, 135, multilayer PCBs 110, 170, connector bodies 120, 140, 160, 180, dielectric 123, connecting part 125, single-side PCB 130 and double-side PCBs 150, 190 are illustrated. FIG. 2 shows the cutting line (k)-(k'), on which the sectional view of FIG. 1 is formed.

The high-speed switching element 105, 135, which may be diodes for switching, insulated gate bipolar transistors (IGBT) and field-effect transistors (FET), performs a variety of functions, including preventing the distortion of the on-off-controlled switching voltage waveform by switching at a high-speed. When a high-speed pulse operates a switching element, EMI and REI (radio frequency interference) occur.

The single-side PCB 130 has circuits wired on one side of the insulated board; the double-side PCB 150, 190 on both sides; and the multilayer PCB 110, 170 on a multiple of layers. Here, a multilayer substrate refers to a substrate on which the various types of PCBs described above, low temperature co-fired ceramic substrates and multi-layer ceramic substrates are stacked parallel to one another. Below, the method for stacking PCBs is described.

The connector 120, 123, 125, 140, 160, 180 comprises the connector body 120, 140, 160, 180, dielectric 123 and connecting part 125. The connector 120, 123, 125, 140, 160, 180 has a ring-type structure, wherein the shape of the ring depends on the shape of the substrate, to which the ring is coupled, and may be a rectangle. Moreover, the connector 120, 123, 125, 140, 160, 180 has a height that is substantially great enough to prevent the high-speed switching element 105, 135, mounted on the lower substrate, from being in contact with the upper substrate, and functions to support each substrate. The connector 120, 123, 125, 140, 160, 180 can shield EMI generated by the high-speed switching element 105, 135. Electromagnetic shielding is a phenomenon of the external electromagnetic field not affecting the inside of an electronic apparatus or the internal electromagnetic field not affecting the outside of an electronic apparatus when a space is surrounded by an electrical conductor. Therefore, the connector 120, 123, 125, 140, 160, 180 can shield the internal electromagnetic field generated by the high-speed switching element 105, 135, mounted on a substrate, or the external electromagnetic field.

The connector body 120, 140, 160, 180 surrounds the high-speed switching element 105, 135 and can be made from conductive materials, in which case it is grounded. The dielectric 123 is coated on the inside wall of holes formed on the connector, and the connecting part 125 is made from conductive materials and is coated on the dielectric 123. Here, the holes formed on the connector are arranged with a certain distance apart, and the shape can vary, from a rectangle to a circle. The distance between and the number of holes can be decided in accordance with the circuit pattern of the upper and lower substrates. In case the holes are shaped circular, a structure similar to a coaxial cable is formed by the dielectric 123 and the connecting part 125. If a coaxial cable is formed by the holes, constant impedance is formed, and a coupling pin that electrically connects signal lines between substrates can be easily fitted. If the connector body 120, 140, 160, 180 is not of a conductive material, the connecting part 125, which is a conductive material formed on each hole, can perform the role of partially shielding the electromagnetic field.

Here, various embodiments can be implemented as long as the connecting part 125 is a structure that can be connected to the signal line of the circuit on the upper and lower substrates. For example, the connecting part 125 can be coated on the dielectric 123 and be filled in each hole formed on the connector to be electrically connected to the substrate circuit directly. In another embodiment, the connecting part 125 can be coated on the dielectric 123 and be formed in the middle area of the hole to be electrically connected to the substrate circuit, using a coupling pin having a shape corresponding to the space formed by the connecting part 125.

Figure 3:
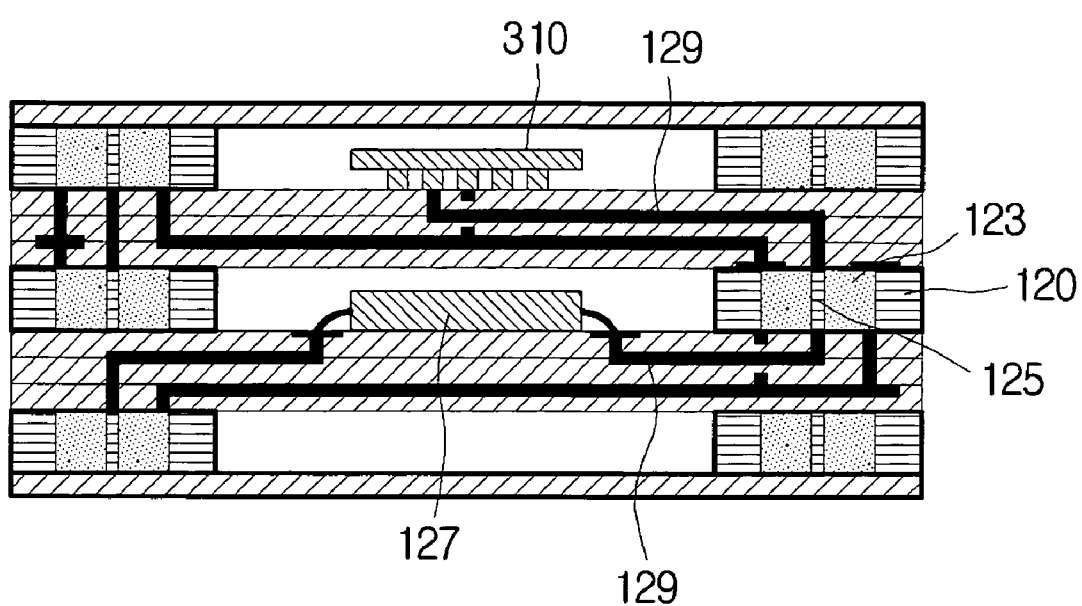
FIG. 3 is a sectional view of a multilayer substrate having a circuit pattern in accordance with a preferred embodiment of the present invention.

FIG. 3 is a sectional view of a multilayer substrate, on which a circuit pattern containing signal lines and a ground line is formed, based on a preferred embodiment of the present invention. Illustrated in FIG. 3 are a connector body 120, a dielectric 123, a connecting part 125, high-speed switching elements 127, 310 and signal lines 129.

Stacked on the upper part and the lower part of the connector 120, 123, 125 is a single-side multilayer PCB, on which a circuit pattern containing the signal lines 129 and a ground line is formed. Here, the signal lines 129 of the upper substrate and the lower substrate are electrically connected using the connecting part 125 of the connector. By electrically connecting to the ground line, the connector body 120 can perform the role of shielding the internal electromagnetic field generated by the high-speed switching element 127 mounted on the substrate or the external electromagnetic field generated by the high-speed switching element 310 mounted outside.

Figure 4:
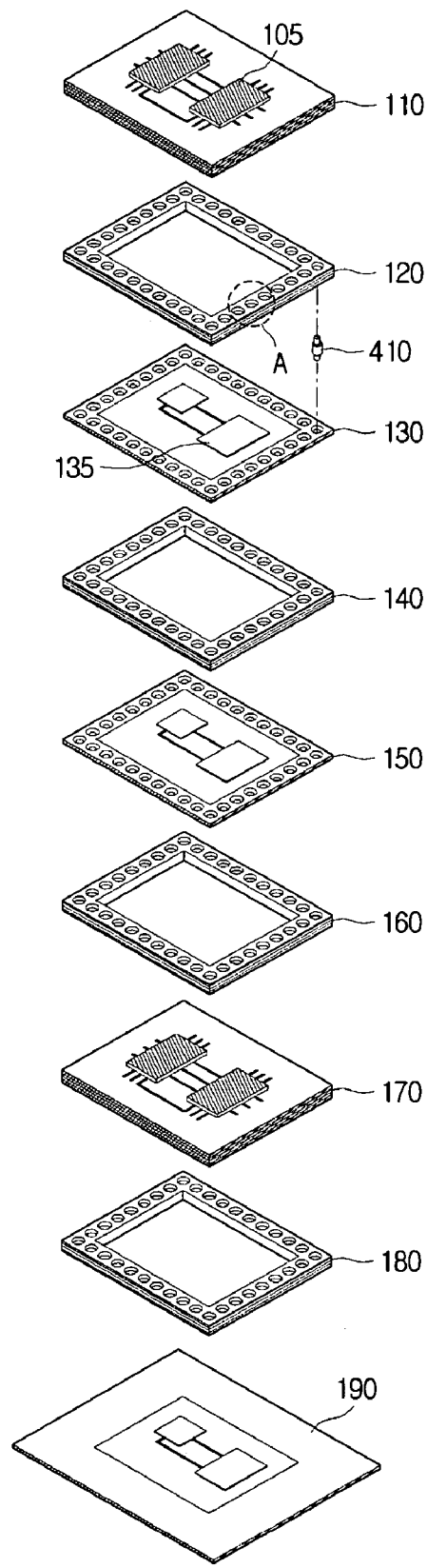
FIG. 4 is an exploded view of a multilayer substrate in accordance with a preferred embodiment of the present invention.
Figure 5:
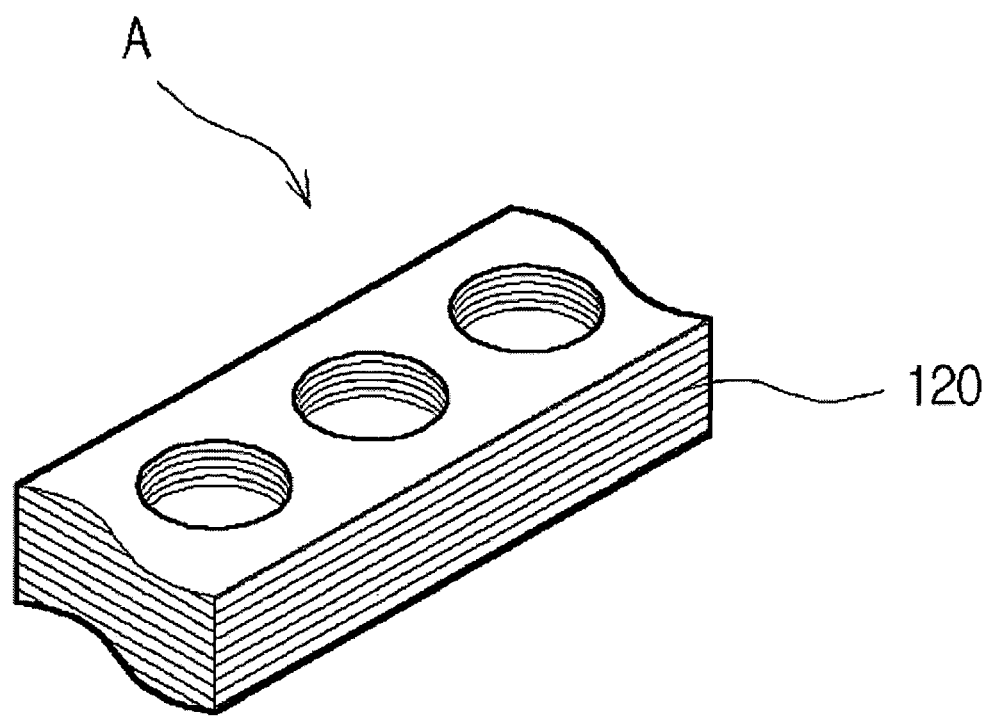
FIG. 5 is an enlarged view of a section of a connector of a multilayer substrate in accordance with a preferred embodiment of the present invention.

FIG. 4 is an exploded perspective view of a multilayer substrate containing a connector in accordance with a preferred embodiment of the present invention, and FIG. 5 is an enlarged view of a section of the connector indicated by section A in FIG. 4.

Illustrated in FIG. 4 are multilayer PCBs 110, 170, connector bodies 120, 140, 160, 180, a single-side PCB 130, a high-speed switching element 135, double-side PCBs 150, 190 and a coupling pin 410. The multilayer PCBs 110, 170, single-side PCB 130 and double-side PCBs 150, 190 are separately fabricated, and each of these PCBs is coupled by inserting a connector. The number of PCBs to be coupled and connectors depends on the size and features of the system to implement.

The coupling pin 410 connects each of the multilayer PCBs 110, 170, single-side PCB 130 and double-side PCBs 150, 190 and the connecting part of the connector electrically. The coupling pin 410 has protruded parts on both ends, and each protruded end is inserted to a hole formed on the PCB and a hole formed on the connector, respectively. Consequently, the coupling pin 410 is connected to the connecting part formed in the hole of the connector electrically, and connects the signal line formed on each of the PCBs electrically.

So far, a multilayer substrate and a method for producing it have been described with reference to the generally-illustrated sectional views and exploded perspective views. Hereinafter, a multilayer substrate and a method for producing it will be described by use of specific embodiments with reference to the accompanying drawings. Described below are two embodiments, the first of which is a method of using the coupling pin on one side of the connector to connect to the substrate, and the second of which is using the coupling pin on both sides of the connector to connect to the substrate.

Figure 6:
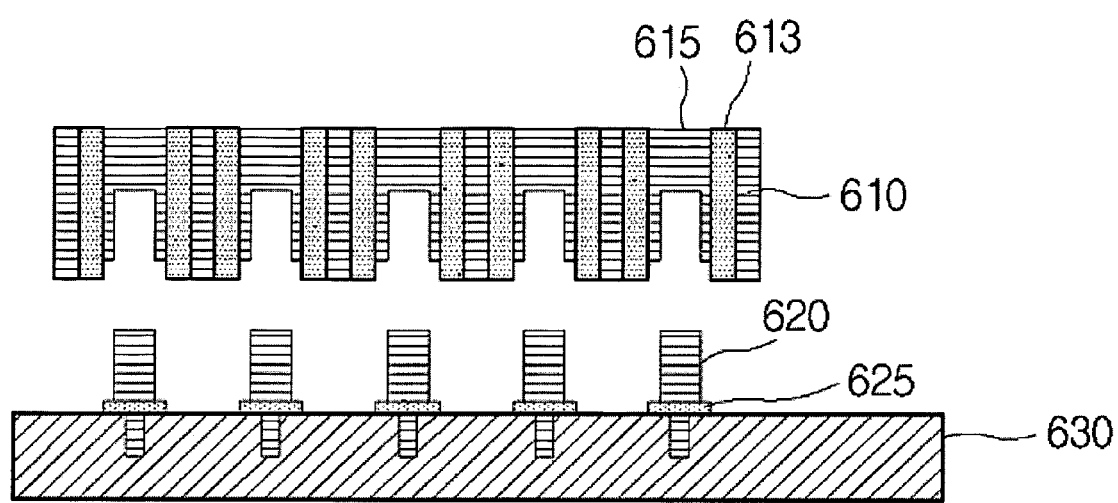
FIG. 6 shows the connection between the connector of a multilayer substrate and the substrate in accordance with a first preferred embodiment of the present invention.

FIG. 6 illustrates one side of the connector connecting to the substrate using the coupling pin in accordance with a first preferred embodiment of the present invention. Shown in FIG. 6 are a connector body 610, a dielectric 613, a connecting part 615, a coupling pin 620, a coupling pin fixing part 625 and a PCB 630.

The coupling pin 620, which is a conductive material, has at one end a protruded part that corresponds to the shape of a space formed by the connecting part 615 of the connector, and at the other end another protruded part that corresponds to the shape of a slot formed on the PCB 630. Here, the slot formed on the PCB 630 may be a via hole. In case the coupling pin 620 couples onto the connecting part 615 of the connector and the PCB 630, using the protruded parts, the signal line in the PCB 630 is electrically connected to the connecting part 615 of the connector by the coupling pin 620.

The coupling pin fixing part 625 fixes the coupling pin 620 to the PCB 630. The coupling pin fixing part 625 may be made from lead, in which case the coupling pin fixing part 625 may be molten during the reflow soldering such that the coupling pin 620 is fixed to the PCB 630.

Here, the connecting part 615 of the connector is extended all the way to the top of the connector. Thus, the connecting part 615 of the connector may be directly in contact with the signal circuit of another PCB stacked on the top of the connector.

Figure 7:
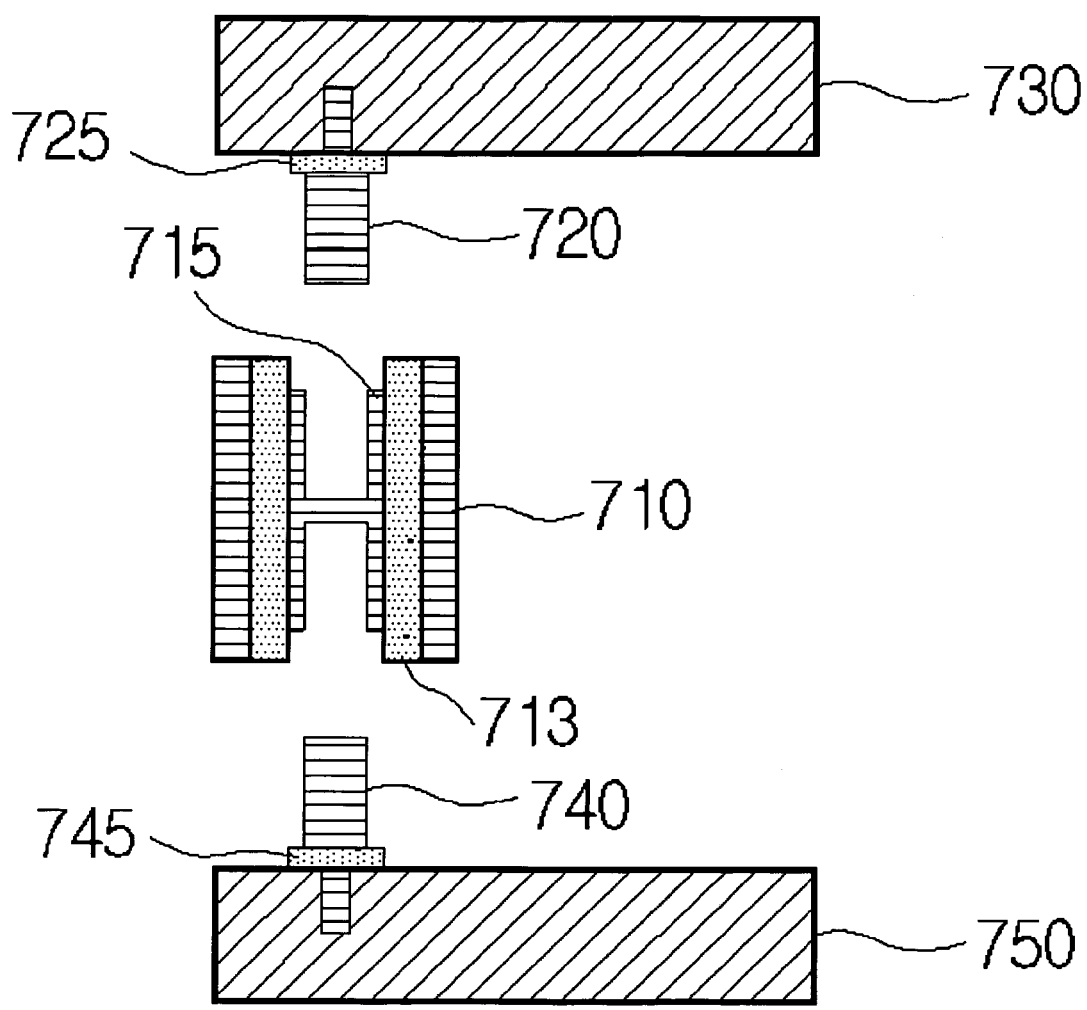
FIG. 7 shows the connection between the connector of a multilayer substrate and the substrate in accordance with a second preferred embodiment of the present invention.

FIG. 7 illustrates the connector of a multilayer substrate connecting to the substrate in accordance with a second preferred embodiment of the present invention. Illustrated in FIG. 7 are a connector body 710, a dielectric 713, a connecting part 715, coupling pins 720, 740, coupling pin fixing parts 725, 745, a first PCB 750 and a second PCB 730. The description for the coupling pin 720, 740 and the coupling pin fixing part 725, 745 is identical to the first embodiment, and only the differences will be described below.

The first PCB 750 and the second PCB 730 are coupled by the insertion of a connector. Here, the connecting part 715 has at both ends slots corresponding to the protruded parts of the coupling pins 740, 720 such that the coupling pins 740, 720, coupled onto the first PCB 750 and the second PCB 730, can fit in. The signal circuits on the first PCB 750 and the second PCB 730 maybe electrically connected with each other through the coupling pins 740, 720.

Here, separate coupling pins 740, 720 are inserted in the upper slot and the lower slot because the cross section of the connecting part 715 has an "H" shape. If the connecting part 715 is absent or transpierced, however, the signal circuit on the first PCB 750 and the signal circuit on the second PCB 730 may be electrically connected by use of a single coupling pin.

As described above, a multilayer substrate and a method for producing it in accordance with the present invention can shield the EMI generated by a high-speed switching element.

Moreover, a multilayer substrate and a method for producing it in accordance with the present invention can improve the signal integrity and EMI capacity by sufficiently securing a feedback current path.

Furthermore, a multilayer substrate and a method for producing it in accordance with the present invention can provide constant impedance by delivering the signal current through a coaxial cable between substrates.

The present invention is by no means restricted by the aforementioned embodiments, and anyone of ordinary skill in the art to which the invention pertains shall be able to understand that a very large number of permutations are possible within the scope of the invention.

What is claimed is:

1. A multilayer substrate comprising:
a first substrate, the first substrate having a circuit pattern;
a connector, the connector coupling onto the first substrate; and
a second substrate, the second substrate coupling onto the first substrate by inserting the connector, the second substrate having a circuit pattern,
wherein the connector comprises
a body, the body being comprised of a conductive material, the body having a ring structure, the ring structure having a plurality of holes separated a predetermined distance from one another;
a dielectric, the dielectric coating the inside wall of the plurality of holes; and
a connecting part, the connecting part being comprised of a conductive material, the conductive material coating the dielectric,
wherein the circuit pattern formed on the second substrate is electrically connected to the circuit pattern formed on the first substrate via the connecting part.

2. A multilayer substrate comprising:
a first substrate having a circuit pattern;
a second substrate having a circuit pattern; and
a ring-shaped connector to connect the first substrate to the second substrate, the connector having a plurality of holes formed in a body of the connector,
wherein a dielectric coating is formed along an inside wall of each of the holes and a conductive connecting part is formed inside the dielectric coating of each of the holes.

* * * * *